US012562410B2

(12) United States Patent
Harada et al.

(10) Patent No.: US 12,562,410 B2
(45) Date of Patent: Feb. 24, 2026

(54) CHARGE CONTROL METHOD, CHARGE CONTROL APPARATUS, AND BATTERY-MOUNTED EQUIPMENT

(71) Applicant: KABUSHIKI KAISHA TOSHIBA, Tokyo (JP)

(72) Inventors: Yasuhiro Harada, Isehara Kanagawa (JP); Kazuki Ise, Kawasaki Kanagawa (JP); Yasunobu Yamashita, Tokyo (JP); Norio Takami, Yokohama Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 740 days.

(21) Appl. No.: 17/822,752

(22) Filed: Aug. 26, 2022

(65) Prior Publication Data

US 2023/0299370 A1     Sep. 21, 2023

(30) Foreign Application Priority Data

Mar. 17, 2022     (JP) ................................. 2022-042566

(51) Int. Cl.
| | |
|---|---|
| *H02J 7/00* | (2006.01) |
| *H01M 10/44* | (2006.01) |
| *H01M 10/48* | (2006.01) |
| *G01R 31/392* | (2019.01) |
| *H01M 4/02* | (2006.01) |
(Continued)

(52) U.S. Cl.
CPC ....... *H01M 10/443* (2013.01); *H01M 10/486* (2013.01); *H02J 7/007194* (2020.01); *G01R 31/392* (2019.01); *H01M 2004/027* (2013.01); *H01M 4/483* (2013.01); *H01M 10/0525* (2013.01); *H02J 7/0048* (2020.01); *H02J*

*7/005* (2020.01); *H02J 7/0071* (2020.01); *H02J 7/007182* (2020.01); *H02J 7/007188* (2020.01)

(58) Field of Classification Search
CPC ............... H01M 10/443; H01M 10/486; H02J 7/007194
USPC ......................................................... 320/150
See application file for complete search history.

(56) References Cited

U.S. PATENT DOCUMENTS

| | | | |
|---|---|---|---|
| 5,563,496 A | 10/1996 | McClure | |
| 5,637,982 A * | 6/1997 | Nanno .............. | H02J 7/007192 |
| | | | 320/155 |

(Continued)

FOREIGN PATENT DOCUMENTS

| | | |
|---|---|---|
| CN | 110492572 A | 11/2019 |
| EP | 3 319 203 A1 | 5/2018 |

(Continued)

OTHER PUBLICATIONS

Japan Patent Office, Office Action in JP App. No. 2022-042566, 4 pages, and machine translation, 4 pages (Jan. 21, 2025).

*Primary Examiner* — John T Trischler
(74) *Attorney, Agent, or Firm* — Finnegan, Henderson, Farabow, Garrett & Dunner, LLP

(57) ABSTRACT

A charge control method includes acquiring a measured temperature of a lithium ion battery, acquiring a threshold value for stopping charging of the lithium ion battery according to the measured temperature of the lithium ion battery based on a relationship between a cycle life and a charging capacity of the lithium ion battery for each temperature of the lithium ion battery, and, charging the lithium ion battery based on the threshold value.

4 Claims, 7 Drawing Sheets

(51) Int. Cl.
    *H01M 4/48*        (2010.01)
    *H01M 10/0525*      (2010.01)

(56)            References Cited

U.S. PATENT DOCUMENTS

| 6,515,452 | B2 * | 2/2003 | Choo ................... | H02J 7/0048 |
| | | | | 320/132 |
| 6,657,415 | B2 * | 12/2003 | Saeki ................. | H02J 7/00714 |
| | | | | 320/152 |
| 6,714,882 | B1 * | 3/2004 | Iwaizono .............. | H02J 7/0031 |
| | | | | 702/136 |
| 6,771,491 | B2 * | 8/2004 | Tojo ................. | H01M 10/4257 |
| | | | | 324/426 |
| 6,910,143 | B2 * | 6/2005 | Odaohhara .............. | G06F 1/28 |
| | | | | 713/340 |
| 7,211,987 | B2 * | 5/2007 | Aoki ................... | H01M 10/44 |
| | | | | 324/425 |
| 7,429,849 | B2 * | 9/2008 | Shoji ................. | G01R 31/3842 |
| | | | | 324/426 |
| 7,545,109 | B2 * | 6/2009 | Salman ................... | B60L 3/12 |
| | | | | 388/806 |
| 7,710,078 | B2 * | 5/2010 | Miller .............. | H02J 7/007194 |
| | | | | 320/150 |
| 7,777,456 | B2 * | 8/2010 | Morita ................. | H02J 7/0018 |
| | | | | 363/149 |
| 7,825,634 | B2 * | 11/2010 | Kishi ................. | H01M 10/443 |
| | | | | 320/144 |
| 7,880,438 | B1 * | 2/2011 | Cohen ................... | H02J 7/0048 |
| | | | | 320/132 |
| 7,974,797 | B2 * | 7/2011 | Shoji ................... | G01R 31/396 |
| | | | | 320/155 |
| 8,013,577 | B2 * | 9/2011 | Nishino ............. | H01M 10/441 |
| | | | | 320/152 |
| 8,305,044 | B2 * | 11/2012 | Kawamoto ......... | H01M 10/443 |
| | | | | 320/152 |
| 8,324,865 | B1 * | 12/2012 | Cohen ................. | G01R 31/386 |
| | | | | 320/132 |
| 8,384,353 | B2 * | 2/2013 | Miyazaki ............ | H01M 10/443 |
| | | | | 320/120 |
| 8,410,760 | B2 * | 4/2013 | Formanski .......... | H01M 10/443 |
| | | | | 429/61 |
| 8,433,938 | B2 * | 4/2013 | Cha ......................... | G06F 1/206 |
| | | | | 713/340 |
| 8,482,262 | B2 * | 7/2013 | Takami ................. | H01M 4/131 |
| | | | | 320/148 |
| 8,489,264 | B2 * | 7/2013 | Morita ................... | B60L 58/10 |
| | | | | 320/136 |
| 8,655,524 | B2 * | 2/2014 | Ichikawa ............... | B60L 58/20 |
| | | | | 701/22 |
| 8,937,452 | B2 * | 1/2015 | Schwarz .............. | H01M 10/42 |
| | | | | 320/134 |
| 9,093,844 | B2 * | 7/2015 | Yonezawa ................ | H02J 7/00 |
| 9,219,377 | B2 * | 12/2015 | Nagakura ......... | H02J 7/007182 |
| 9,405,352 | B2 * | 8/2016 | Cha ......................... | G06F 1/206 |
| 9,753,094 | B2 * | 9/2017 | Thompson ........... | G01R 31/374 |
| 9,827,872 | B1 * | 11/2017 | Sloan ...................... | B60L 58/26 |
| 10,046,652 | B2 * | 8/2018 | Yoshida ............... | B60W 20/13 |
| 10,046,664 | B2 * | 8/2018 | Komiyama .......... | G01R 31/389 |
| 10,079,390 | B2 * | 9/2018 | Matsuno ............ | B60L 50/66 |
| 10,283,820 | B2 * | 5/2019 | Sugeno ................ | H02J 7/0029 |
| 10,461,377 | B2 * | 10/2019 | Nam ........................ | H02J 7/04 |
| 11,211,601 | B2 * | 12/2021 | Hoshina .............. | H01M 4/621 |
| 11,251,627 | B2 * | 2/2022 | Fukaya .............. | B60L 58/16 |
| 11,342,769 | B2 * | 5/2022 | Watanabe ............. | F02D 29/02 |
| 11,518,271 | B2 * | 12/2022 | Okamoto ............... | B60L 53/20 |
| 11,563,238 | B2 * | 1/2023 | Tajima ................... | B60L 58/21 |
| 11,750,012 | B2 * | 9/2023 | Zhu ...................... | G01R 31/392 |
| | | | | 320/137 |
| 11,762,027 | B2 * | 9/2023 | Xu ........................ | H02J 7/0013 |
| | | | | 320/134 |
| 11,888,340 | B2 * | 1/2024 | Nagabhushanrao .. | H02J 7/0047 |
| 11,984,562 | B2 * | 5/2024 | Tajima ................. | B60L 58/16 |
| 12,032,034 | B2 * | 7/2024 | Liu ...................... | H02J 7/0047 |

| 12,235,710 | B2 * | 2/2025 | Duncan .................... | H02J 9/06 |
| 2002/0093312 | A1 * | 7/2002 | Choo ................. | G01R 31/3842 |
| | | | | 320/149 |
| 2002/0097022 | A1 * | 7/2002 | Saeki ............... | H02J 7/007182 |
| | | | | 320/125 |
| 2002/0144160 | A1 | 10/2002 | Odaohhara et al. | |
| 2003/0057918 | A1 * | 3/2003 | Aoki ..................... | H02J 7/0048 |
| | | | | 320/136 |
| 2003/0076072 | A1 * | 4/2003 | Tojo .................. | H01M 10/4257 |
| | | | | 320/134 |
| 2005/0110466 | A1 * | 5/2005 | Shoji ................... | G01R 31/396 |
| | | | | 320/150 |
| 2006/0068272 | A1 * | 3/2006 | Takami ............. | H01M 10/6563 |
| | | | | 429/61 |
| 2007/0059587 | A1 | 3/2007 | Kishi et al. | |
| 2007/0152639 | A1 * | 7/2007 | Miller .............. | H02J 7/007194 |
| | | | | 320/150 |
| 2008/0129252 | A1 * | 6/2008 | Nishino ............. | H01M 10/441 |
| | | | | 320/162 |
| 2008/0150457 | A1 * | 6/2008 | Salman .................... | B60L 3/12 |
| | | | | 318/139 |
| 2009/0024339 | A1 * | 1/2009 | Shoji ................... | G01R 31/392 |
| | | | | 702/63 |
| 2009/0037754 | A1 * | 2/2009 | Cha ......................... | G06F 1/206 |
| | | | | 713/601 |
| 2009/0072791 | A1 * | 3/2009 | Morita ................. | H02J 7/0018 |
| | | | | 320/134 |
| 2009/0155674 | A1 * | 6/2009 | Ikeuchi .............. | H01M 10/482 |
| | | | | 429/91 |
| 2010/0007310 | A1 * | 1/2010 | Kawamoto ........ | H01M 10/486 |
| | | | | 320/134 |
| 2010/0201326 | A1 * | 8/2010 | Takami .............. | H01M 4/5825 |
| | | | | 320/152 |
| 2010/0217466 | A1 * | 8/2010 | Ichikawa ............... | B60L 58/24 |
| | | | | 701/22 |
| 2010/0250038 | A1 * | 9/2010 | Morita ................... | B60L 58/12 |
| | | | | 320/136 |
| 2010/0270973 | A1 * | 10/2010 | Miyazaki ............ | H02J 7/00036 |
| | | | | 320/120 |
| 2010/0283431 | A1 * | 11/2010 | Kano ..................... | G06F 1/203 |
| | | | | 361/679.48 |
| 2012/0007556 | A1 * | 1/2012 | Matsui .................... | B60L 58/18 |
| | | | | 320/112 |
| 2012/0029724 | A1 * | 2/2012 | Formanski .......... | H01M 10/443 |
| | | | | 324/426 |
| 2012/0130655 | A1 * | 5/2012 | Mitsuda ............... | G01R 31/392 |
| | | | | 702/58 |
| 2012/0200257 | A1 * | 8/2012 | Schwarz ............ | H01M 10/486 |
| | | | | 320/109 |
| 2013/0069584 | A1 | 3/2013 | Nagakura | |
| 2013/0119939 | A1 * | 5/2013 | Yonezawa ................ | H02J 7/00 |
| | | | | 320/134 |
| 2013/0227322 | A1 * | 8/2013 | Cha ......................... | G06F 1/324 |
| | | | | 713/322 |
| 2014/0184235 | A1 * | 7/2014 | Ikeuchi ............... | H01M 10/443 |
| | | | | 324/427 |
| 2016/0097820 | A1 * | 4/2016 | Thompson ........... | G01R 31/374 |
| | | | | 320/134 |
| 2016/0294021 | A1 * | 10/2016 | Ueno ................ | H01M 10/443 |
| 2016/0325633 | A1 * | 11/2016 | Yoshida .............. | B60W 50/082 |
| 2016/0375790 | A1 * | 12/2016 | Komiyama ............. | B60L 58/12 |
| | | | | 320/136 |
| 2016/0377686 | A1 * | 12/2016 | Uchida ............. | G01R 31/3842 |
| | | | | 702/63 |
| 2017/0271682 | A1 * | 9/2017 | Matsuno ............. | H01M 10/24 |
| 2018/0115024 | A1 * | 4/2018 | Sugeno .................... | H02J 7/35 |
| 2018/0175461 | A1 * | 6/2018 | Nam ................. | H01M 10/486 |
| 2018/0226695 | A1 * | 8/2018 | Miyaki ................ | H01M 4/505 |
| 2019/0334371 | A1 * | 10/2019 | Watanabe ............ | B60W 10/08 |
| 2020/0091505 | A1 * | 3/2020 | Hoshina ................ | H01M 4/485 |
| 2021/0005939 | A1 * | 1/2021 | Tajima .............. | H01M 10/482 |
| 2021/0075225 | A1 * | 3/2021 | Fukaya .............. | H01M 10/486 |
| 2021/0099003 | A1 * | 4/2021 | Zhu ................. | H01M 10/443 |
| 2021/0101504 | A1 * | 4/2021 | Okamoto ................ | H02J 7/04 |
| 2022/0085638 | A1 * | 3/2022 | Sugizaki .......... | H02J 7/007194 |
| 2022/0181897 | A1 * | 6/2022 | Nagabhushanrao .. | H02J 7/0047 |
| 2022/0236329 | A1 * | 7/2022 | Honkura ................ | H02J 7/00 |

(56) References Cited

U.S. PATENT DOCUMENTS

| | | | |
|---|---|---|---|
| 2022/0268845 A1* | 8/2022 | Xu | H02J 7/0013 |
| 2023/0014689 A1* | 1/2023 | Ogasawara | G01R 31/392 |
| 2023/0064748 A1* | 3/2023 | Liu | G01R 31/374 |
| 2023/0132746 A1* | 5/2023 | Tajima | B60L 58/21 |
| | | | 429/90 |
| 2023/0229225 A1* | 7/2023 | Duncan | H02J 7/007192 |
| | | | 713/320 |
| 2023/0236256 A1* | 7/2023 | Okabe | H02J 7/00714 |
| | | | 702/63 |
| 2023/0402670 A1* | 12/2023 | Sasaki | H01M 10/486 |
| 2024/0085483 A1* | 3/2024 | Shen | H02J 7/007194 |
| 2024/0097476 A1* | 3/2024 | Hoshina | H01M 10/443 |
| 2024/0120761 A1* | 4/2024 | Nagabhushanrao | |
| | | | H02J 7/007194 |
| 2024/0145760 A1* | 5/2024 | Pan | H01M 4/134 |

FOREIGN PATENT DOCUMENTS

| | | | |
|---|---|---|---|
| EP | 3 627 596 A1 | 3/2020 | |
| JP | 2001-283929 A | 10/2001 | |
| JP | 2007-80575 A | 3/2007 | |
| JP | 2012-16263 A | 1/2012 | |
| JP | 2016-144285 A | 8/2016 | |
| JP | 2016-181985 A | 10/2016 | |
| JP | 2016-214058 A | 12/2016 | |
| JP | 2019-170078 A | 10/2019 | |
| WO | WO-2014104280 A1 * | 7/2014 | H01M 10/052 |

* cited by examiner

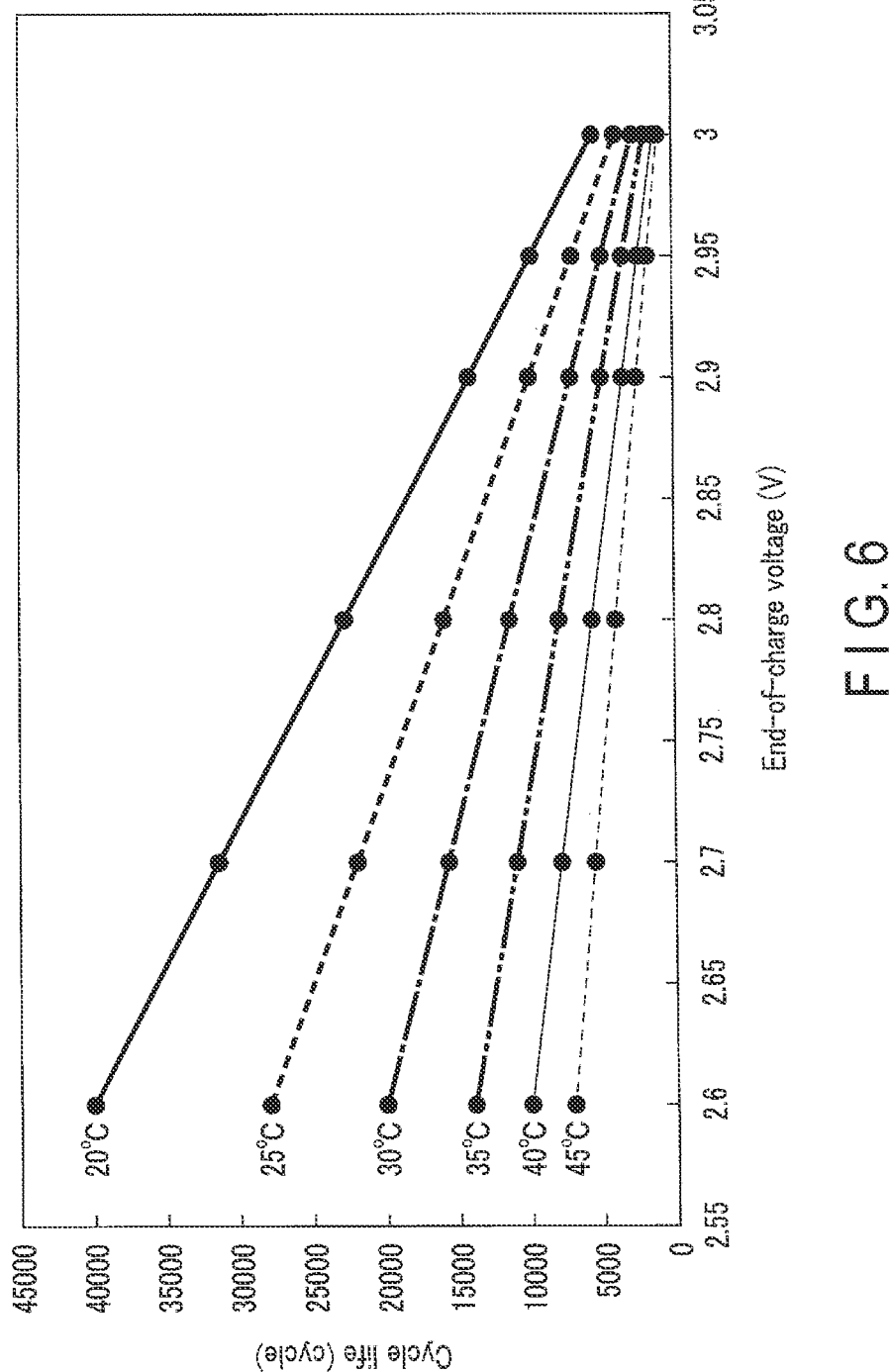
F I G. 6

CHARGE CONTROL METHOD, CHARGE CONTROL APPARATUS, AND BATTERY-MOUNTED EQUIPMENT

CROSS-REFERENCE TO RELATED APPLICATIONS

This application is based upon and claims the benefit of priority from the Japanese Patent Application No. 2022-042566, filed Mar. 17, 2022, the entire contents of which are incorporated herein by reference.

FIELD

Embodiments described herein relate generally to a charge control method, a charge control method, and battery-mounted equipment.

BACKGROUND

In recent years, secondary batteries such as lithium-ion batteries have been mounted on battery-mounted equipment such as smartphones, vehicles, stationary power supplies, robots, and drones. Also, in recent years, batteries in which an oxide containing niobium titanium is used as a negative electrode active material nave been used in the battery-mounted equipment to increase the charging capacity and enable rapid charging. Charging and discharging of such batteries are controlled by a controller mounted on or separate from the battery-mounted equipment.

The life of battery cells in which an active material containing niobium titanium is used as a negative electrode active material is especially likely to decrease when an electric potential of a negative electrode is exposed to a low electric potential. Specifically, even if charging is performed at the same charging voltage, the longer the electric potential of the negative electrode is exposed to a low electric potential, the more likely the battery cell life is to decrease. In addition, the charging capacity of the battery cells in which an active material containing niobium titanium is used as a negative electrode active material tends to Increase at higher temperatures. Thus, even if charging is performed at the same charging voltage, the higher the temperature, the more excess lithium ions are inserted, and as a result, the life of the battery cell is likely to decrease. Hence, in order to further extend the life of battery cells while also enabling high-capacity charging, there is a need for charge control that takes the temperature of the battery cells into account.

BRIEF DESCRIPTION OF THE DRAWINGS

FIG. 6 is a diagram showing an example of information further stored in a storage in a second embodiment.

DETAILED DESCRIPTION

In general, according to one embodiment, a charge control method includes acquiring a measured temperature of a lithium ion battery, acquiring a threshold value for stopping charging of the lithium ion battery according to the measured temperature of the lithium ion battery based on a relationship between a cycle life and a charging capacity of the lithium ion battery for each temperature of the lithium ion battery, and, charging the lithium ion battery based on the threshold value.

Embodiments will be described below with reference to the drawings.

First Embodiment

Figure 1:
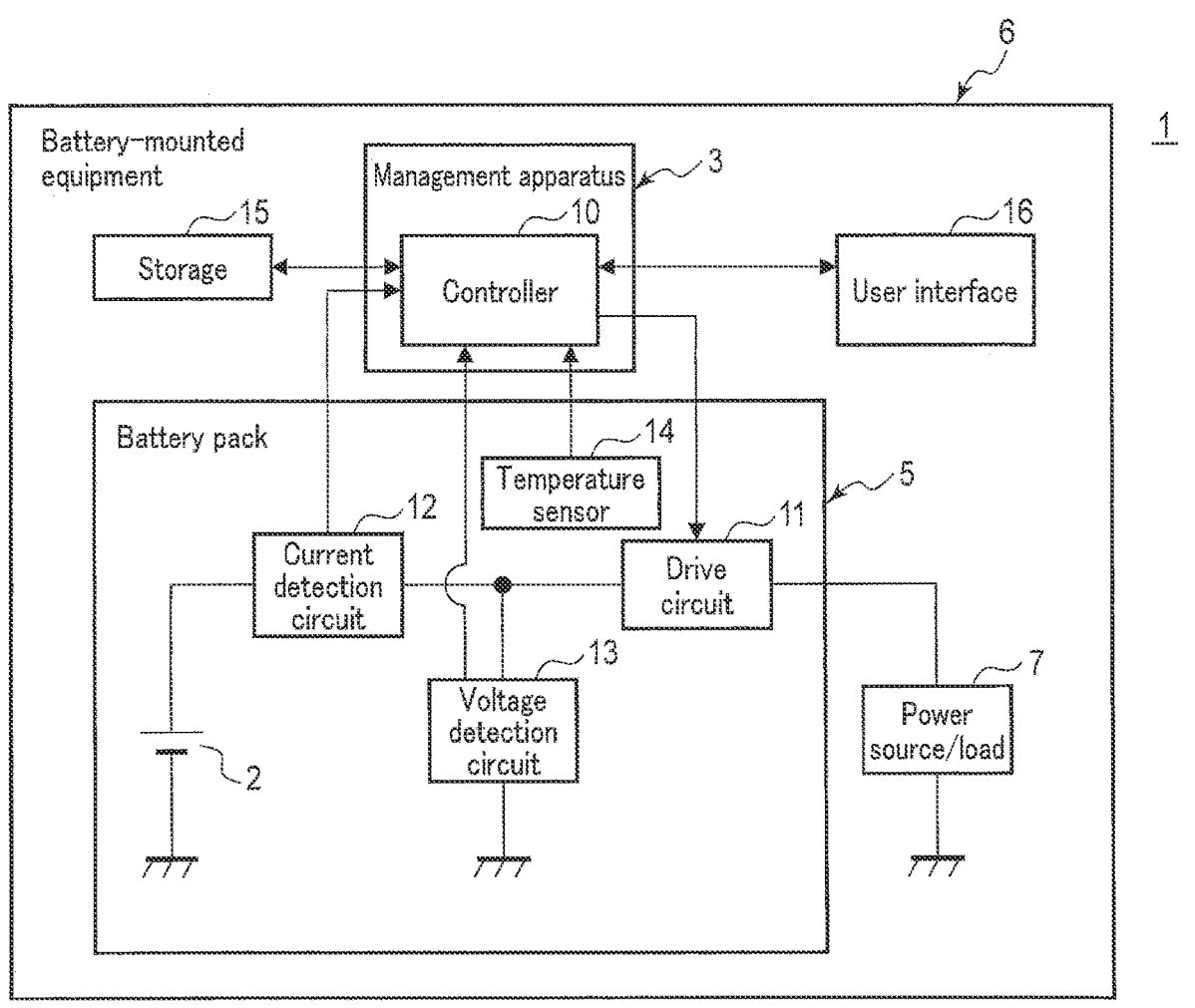
FIG. 1 is a diagram showing an example of a charge control apparatus according to each embodiment.

First, a first embodiment is described FIG. 1 is a diagram showing an example of a charge control apparatus according to each embodiment. As shown in FIG. 1, a charge control apparatus 1 includes a battery 2 and a management apparatus 3. The battery 2 is mounted on a battery pack 5. In the battery pack 5, the battery 2 is, for example, arranged in a state of being constrained to a housing (not shown) of the battery pack 5. The battery pack 5 is mounted on battery-mounted equipment 6. Examples of the battery-mounted equipment 6 include a smartphone, a vehicle, a stationary power supply, a robot, and a drone. Examples of the vehicle as the battery-mounted equipment 6 include an electric vehicle, a plug-in hybrid vehicle, and an electric motorcycle. Further, an example of the robot on which the battery 2 is mounted is a transport robot such as an automated guided vehicle (AGV) used in factories, etc. At least the battery 2 may not be mounted on the charge control apparatus 1. In this case, the charge control apparatus 1 may control the battery 2 using communications, etc.

The battery 2 may be formed of a single cell, or may be formed of a cell block or battery module in which a plurality of single cells are electrically coupled. When the battery 2 is a cell block or battery module, the battery 2 may have an in-series coupling structure in which a plurality of single cells are coupled in series, an in-parallel coupling structure in which a plurality of single cells are coupled in parallel, or both the in-series and in-parallel coupling structures. Furthermore, the battery 2 may be a storage battery in which a plurality of battery modules are electrically coupled. In this case, the battery 2 may have an in-series coupling structure in which multiple battery modules are coupled in series, an in-parallel coupling structure in which multiple battery modules are connected in parallel, or both the in-series and in-parallel coupling structures.

A single cell is, for example, a battery cell that forms a lithium ion battery. A single cell has an electrode group. The electrode group has a positive electrode and a negative electrode. A separator is interposed between the positive electrode and the negative electrode. The separator is formed from an electrically insulating material, and electrically insulates the positive electrode from the negative electrode. Examples of the separator include, but are not limited to, a porous film made of synthetic resin, a non-woven fabric, etc.

The positive electrode includes a positive electrode current collector such as a positive electrode current collecting foil, and a positive electrode active material-containing layer supported on a surface of the positive electrode current collector. The positive electrode current collector is, but is not limited to, for example, an aluminum foil or an aluminum alloy foil. A thickness of the positive electrode current collector is, for example, about 10 μm to 20 μm. The positive electrode active material-containing layer includes a positive electrode active material, and may optionally contain a binding agent and a conductive agent. Examples of the positive electrode active material include, but are not limited to, an oxide, a sulfide, and a polymer, which can occlude and release lithium ions. The positive electrode active material includes, for example, at least one selected from a group consisting of a manganese dioxide, an iron oxide, a copper oxide, a nickel oxide, a lithium-manganese composite oxide, a lithium-nickel composite oxide, a lithium-cobalt composite oxide, a lithium-nickel-cobalt composite oxide, a lithium-manganese-cobalt composite oxide, a spinel-type lithium-manganese-nickel composite oxide, a lithium-phosphorus oxide having an olivine structure, an iron sulfate, and a vanadium oxide. The positive electrode current collector also includes a positive electrode current collecting tab as a portion where the positive electrode active material-containing layer is unsupported.

The negative electrode includes a negative electrode current collector, such as a negative electrode current collecting foil, and a negative electrode active material-containing layer supported on a surface of the negative electrode current collector. The negative electrode current collector is, but is not limited to, for example, an aluminum foil, an aluminum alloy foil, or a copper foil. A thickness of the negative electrode current collector is, for example, about 10 μm to 20 μm. The negative electrode active material-containing layer includes a negative electrode active material, and may optionally contain a binding agent and a conductive agent. Examples of the negative electrode active material include, but are not particularly limited to, a metal oxide, a metal sulfide, a metal nitride, and a carbonaceous material, which can occlude and release lithium ions. Examples of the metal oxide as the negative electrode active material include a titanium-containing oxide. Examples of the titanium-containing oxide as the negative electrode active material include, for example, a titanium oxide, a lithium-titanium-containing composite oxide, a niobium-titanium-containing composite oxide, and a sodium-niobium-titanium-containing composite oxide. Further, examples of the carbonaceous material as the negative electrode active material include graphite, etc. In the embodiment, the negative electrode active material is preferably a niobium-containing oxide, such as a niobium-titanium-Containing composite oxide and a sodium-niobium-titanium-containing composite oxide. The use of an oxide containing niobium for the negative electrode active material allows rapid charging while increasing the charging capacity. The negative electrode current collector includes a negative electrode current collecting tab as a portion where the negative electrode active material-containing layer is unsupported.

As shown in FIG. 1, the battery 2 may be coupled to a power source and/or load 7. When the power source is coupled to the battery 2, the battery 2 is charged by power supply from the power source. On the other hand, when the load is coupled to the battery 2, the battery 2 supplies power to drive the load. The power source may be a battery separate from the battery 2, or may be a generator, etc. The load may be a motor, light, etc. In one example, a capacitor may be coupled to the battery 2 instead of or in addition to the load. The capacitor may store power supplied from the battery 2. In another example, a motor generator may be coupled to the battery 2. In this case, the battery 2 can supply power to the motor generator and is charged by receiving power from the motor generator. That is, the motor generator can operate as both the power source and the load. In FIG. 1, the power source and/or load 7 is mounted on the battery-mounted equipment 6, but is not limited thereto. The power source and/or load 7 may be provided outside the battery-mounted equipment 6.

The management apparatus 3 is an apparatus that manages the battery 2. The management apparatus 3 may operate as, for example, a charge control apparatus that controls charging of the battery 2. Further, the management apparatus 3 may operate as, for example, a discharge control apparatus that controls discharging of the battery 2. The management apparatus 3 has a controller 10. In one example of FIG. 1, the management apparatus 3 is mounted on the battery-mounted equipment 6, and constitutes a processing apparatus (computer) in the battery-mounted equipment 6. The controller 10 of the management apparatus 3 includes a processor and a memory. The processor is constituted by a central processing unit (CPU), a graphics processing unit (GPU), a micro processing unit (MPU), etc. The processor may be constituted by an application specific integrated circuit (ASIC), a field programmable gate array (FPGA), a digital signal processor (D5P), etc. There may be two or more processors instead of one. The memory includes a read only memory (ROM) and a random access memory (RAM). The ROM may store a startup program, an adjustment parameter, etc. of the management apparatus 3. The RAM may be used as a work memory during processing by the processor.

The management apparatus 3 may be provided outside the battery-mounted equipment 6. In this case, the management apparatus 3 may be a server, etc. provided outside the battery-mounted equipment 6. In this case, the controller 10 of the battery--mounted equipment 6 performs necessary processing while communicating with the management apparatus 3 provided outside the battery-mounted equipment 6. In addition, the server may be constituted as a cloud server constituted in a cloud environment.

An operation equivalent to that of the management apparatus 3 may be realized by cooperation of internal and external processing apparatuses of the battery-mounted equipment 6. In this case, for example, a server outside the battery-mounted equipment 6 serves as a master processing apparatus, and a processing apparatus mounted on the battery-mounted equipment 6 serves as a slave processing apparatus to realize the operation of the management apparatus 3 as a whole.

Further, in FIG. 1, the battery pack 5 includes a drive circuit 11. The drive circuit 11 causes power supply from the battery 2 to the load to be implemented based on control of the controller 10. Also, the drive circuit 11 causes power supply from the power source to the battery 2 to be implemented based on control of the controller 10. The drive circuit 11 may include a relay circuit. The relay circuit switches the coupling of the battery 2 to either the power source or the load. Further, the drive circuit 11 includes a conversion circuit. The conversion circuit converts power from the power source into direct-current power to be supplied to the battery. In addition, the conversion circuit converts direct-current power from the battery into power to be supplied to the load. The conversion circuit can include a voltage transformer circuit, a DC/AC conversion circuit, and an AC/DC transformer circuit. The drive circuit 11 may be provided outside the battery pack 5.

Further, the battery pack 5 includes a current detection circuit 12, a voltage detection circuit 13, and a temperature sensor 14. The current detection circuit 12, the voltage detection circuit 13, and the temperature sensor 14 form, for example, a measurement circuit mounted on the battery pack 5. By the measurement circuit, parameters associated with the battery 2 are measured. The current detection circuit 12 detects a current flowing to the battery 2 in each of charging, discharging, etc. of the battery 2. The voltage detection circuit 13 detects a voltage of the battery 2 in each of charging, discharging, etc. of the battery 2. The temperature sensor 14 is a temperature sensor such as a thermocouple and a thermistor, and detects a temperature of the battery 2 in each of charging, discharging, etc. of the battery 2. The current detection circuit 12, the voltage detection circuit 13, and the temperature sensor 14 may each make measurements in units of single cells. On the other hand, the current detection circuit 12, the voltage detection circuit 13, and the temperature sensor 14 may each make measurements in units of cell blocks or battery modules. In one example of FIG. 1, the current detection circuit 12, the voltage detection circuit 13, and the temperature sensor 14 are mounted on the battery pack 5. In contrast, the current detection circuit 12 and the voltage detection circuit 13 may be provided outside the battery pack 5. In addition, the temperature sensor 14 may be provided inside the battery 2. Also in this case, the temperature sensor 14 may he provided for each single cell, may be provided for each cell block, or may be provided for each battery module.

Further, the battery-mounted equipment 6 includes a storage 15. The storage 15 may be, for example, constituted by a storage device such as a flash memory. The storage 15 stores a program to be executed by the controller 10. In the embodiment, the storage 15 also stores information indicating a relationship between a temperature and a maximum charging capacity of the battery. The storage 15 may be a storage device such as a hard disk and a solid state drive. Further, the storage 15 may be a magnetic disk, an optical disk (CD-ROM, CD-R, DVD, etc.), a magneto-optical disk (MO, etc.), etc. Furthermore, the information stored in the storage 15 may be stored in a server coupled via a network such as the Internet or a server in a cloud environment. In this case, the controller 10 acquires necessary information via the network.

The battery-mounted equipment 6 includes a user interface 16. The user interface 16 includes an operation device that accepts operations by a user of the battery-mounted equipment 6. The user interface 16 also includes a presentation device that presents various information to the user of the battery-mounted equipment 6. The operation device may include various operation devices such as a button, a dial, and a touch panel. The presentation device may include various presentation devices such as a display and a speaker.

Figure 2:
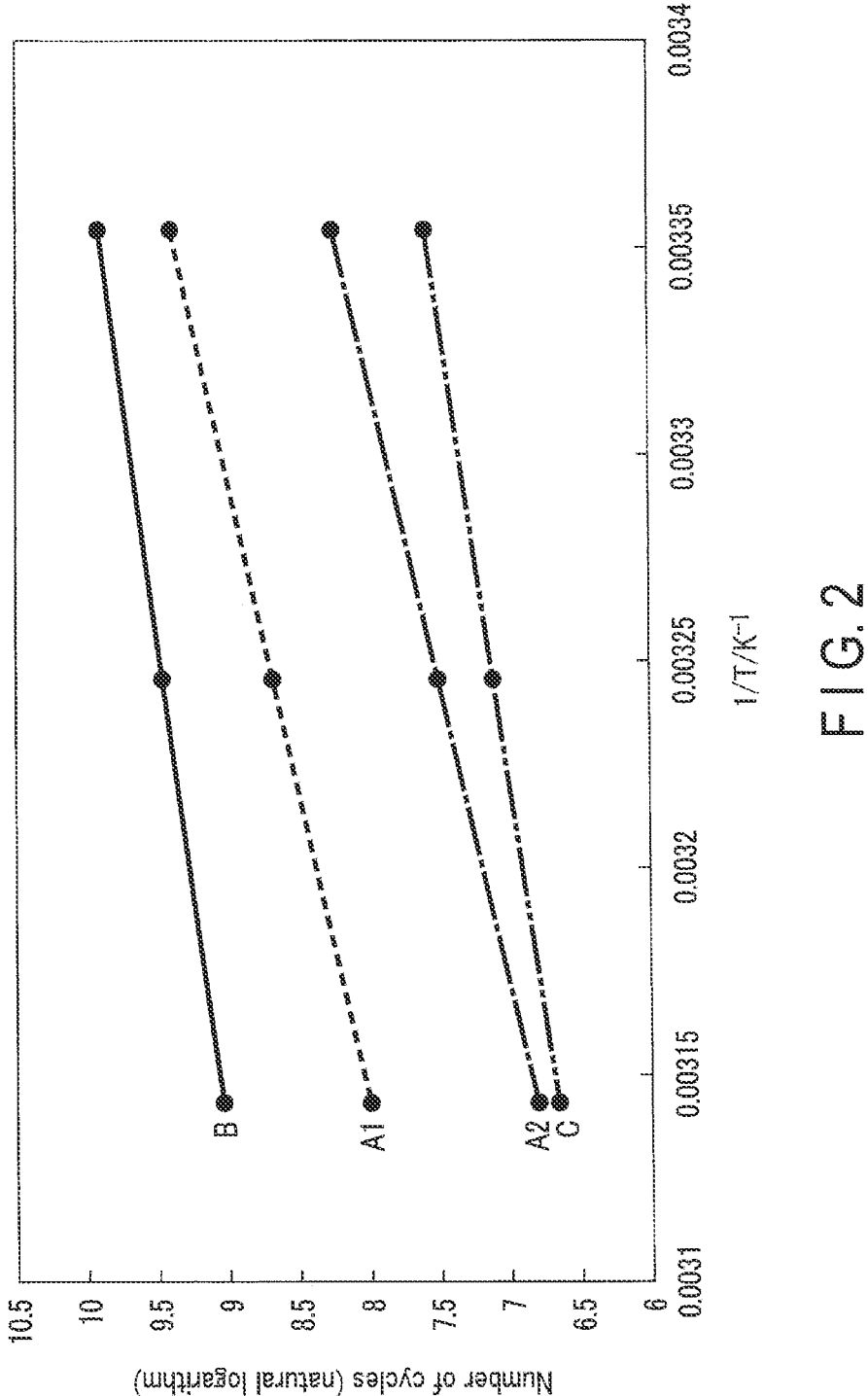
FIG. 2 is a diagram showing an example of a relationship between a cycle life of a battery and a temperature of the battery for each negative electrode active material.

Next, the information stored in the storage 15 in the embodiment will be described. FIG. 2 is a diagram showing an example of a relationship between a cycle life of a battery and a temperature of the battery for each negative electrode active material. An abscissa axis of FIG. 2 indicates a reciprocal of the battery temperature (absolute temperature). On the other hand, an ordinate axis of FIG. 2 indicates a value obtained by taking a natural logarithm of the cycle life. The cycle life is the number of cycles in which degradation of the maximum charging capacity exceeds a certain threshold value. The number of cycles is counted one time when charging from a fully discharged state to a fully charged state and discharging from the fully charged state to a fully discharged state are performed one time each.

In general, the cycle life and the battery temperature follow the Arrhenius equation. According to the Arrhenius equation, the natural logarithm of the cycle life is proportional to the reciprocal of the battery temperature. Based on this, the relationship between the cycle life and the battery temperature is plotted for each kind of negative electrode active material in graphs A1, A2, B, and C in FIG. 2. The graphs of A1 and A2 in FIG. 2 are those when a niobium titanium oxide (NTO) is used as the negative electrode active material. In addition, B in FIG. 2 is a graph when a lithium titanate (LTO) is used as the negative electrode active material. C in FIG. 2 is a graph when a carbonaceous material is used as the negative electrode active material. Furthermore, A1 in FIG. 2 is a graph when an NTO with a long-life design, in which the cycle life is prioritized over the charging capacity, is used. On the other hand, A2 in FIG. 2 is a graph when an NTO with a high-capacity design, in which the charging capacity is prioritized over the cycle life, is used. The NTO with a high-capacity design can be, for example, an NTO having a monoclinic crystal structure. The NTO having a monoclinic crystal structure achieves a higher capacity because lithium diffusion is faster than in NTOs having other crystal structures.

According to the Arrhenius equation, the natural logarithm of the cycle life is proportional to the reciprocal of the battery temperature. Therefore, the graphs A1, A2, B, and C are all nearly straight lines. On the other hand, inclinations of the graphs A1 and A2 are larger than those of the graphs B and C. This indicates that a decrease in cycle life with increasing temperature when the NTO is used as the negative electrode active material is greater than when the LTO or carbonaceous material is used as the negative electrode active material. The reason for this is that when the NTO is used as the negative electrode active material, lithium diffusion tends to be easier at high temperatures than when the LTO or carbonaceous material is used as the negative electrode active material. Easier lithium diffusion facilitates excessive lithium insertion, resulting in the decreased cycle life. As also shown in FIG. 2, the inclination of the graph A2 for the high-capacity design NTO is larger than that of the graph A1 for the long-life design NTO. However, a difference between the inclinations of the graphs A1 and A2 is much smaller than that between the inclinations of the graphs A1 and A2 and those of the graphs B and C. This means that a main reason for the larger decrease in cycle life with the increasing battery temperature is not the difference in NTO design, but the use of the NTO as the negative electrode active material.

To investigate the relationship between the inclinations of the graphs and the cycle life shown in FIG. 2, batteries A1 and A2 using lithium-nickel-manganese-cobalt oxide $LiNi_{1/3}Mn_{1/3}Co_{1/3}O_2$ as the positive electrode and a niobium-titanium oxide $Nb_2TiO_7$ as the negative electrode were prepared. Here, A1 is a long-life design battery with a positive electrode/negative electrode ratio of excess negative electrodes. A2 is a high-capacity design battery with a nearly equal positive electrode to negative electrode ratio. Furthermore, batteries A3, A4, B, and C were prepared for comparison. A3 is a battery using a niobium-tungsten oxide $Ti_2Nb_{10}W_5O_4$ as the negative electrode. A4 is a battery using a niobium-molybdenum oxide $TiNb_5Mo_2O_{20}$ as the negative electrode. B is a battery using lithium titanate $Li_4Ti_5O_{12}$ as a negative electrode active material. C is a battery using graphite as a negative electrode active material.

Next, these batteries were charged and discharged at a rated voltage in a temperature range of 15° C. to 45° C., and inclinations of straight lines obtained from the Arrhenius equation (1) for cycle life and temperature were then determined.

$$\ln k = -\frac{E}{RT} + \ln A \tag{1}$$

If k is the number of cycle lives, and T is an absolute temperature, and −E/R is defined as an inclination of a straight line, and ln A is defined as an intercept, a relationship between ln K and 1/T is approximated by the straight lines shown in FIG. 2.

Next, the cycle life (in this case, the number of cycles to reach a capacity retention rate of 80%) of these batteries was compared in a simulated operation test (temperature range 25° c to 55° C.) under charge control with the maximum charging capacity C max set and constant voltage charging at a rated voltage. A table below shows life improvement rates when the cycle life in a case where charging and discharging are repeated at the rated voltage is set to 100%.

| Cell type | Inclination | Cycle life improvement rate |
| --- | --- | --- |
| A1 | 6573 | 190% |
| A2 | 6829 | 220% |
| A3 | 5683 | 185% |
| A4 | 4561 | 178% |
| B | 4057 | 110% |
| C | 4349 | 125% |

The results shown in the table indicate that when the inclination exceeds 4500, the cycle life improvement rate in the simulated operation test is significantly improved. This means that the presence of a valence of 5 such as niobium in the crystal structure results in a stronger framework structure composed of niobium and oxide ions compared to conventional carbon-based negative electrode materials and lithium titanate, resulting in a higher activation energy in lithium ion movement. As a result, a mobility of lithium ions in the negative electrode differs under a high temperature condition and a low temperature condition, and an apparent charge/discharge amount under a high temperature becomes large. Degradation of the negative electrode of a lithium ion battery with an inclination exceeding 4500 is more accelerated than that of the negative electrode of a lithium ion battery with an inclination of less than 4500. This is considered to be due to the fact that in negative electrode materials with an inclination exceeding 4500, a charged state of the positive electrode and the negative electrode tends to vary, making a degradation mechanism more complex and accelerating the degradation. Therefore, the charge control of the embodiment is highly effective in improving the cycle life at high temperatures, especially with the negative electrode containing a high valence such as niobium, tungsten, and molybdenum.

Figure 3:
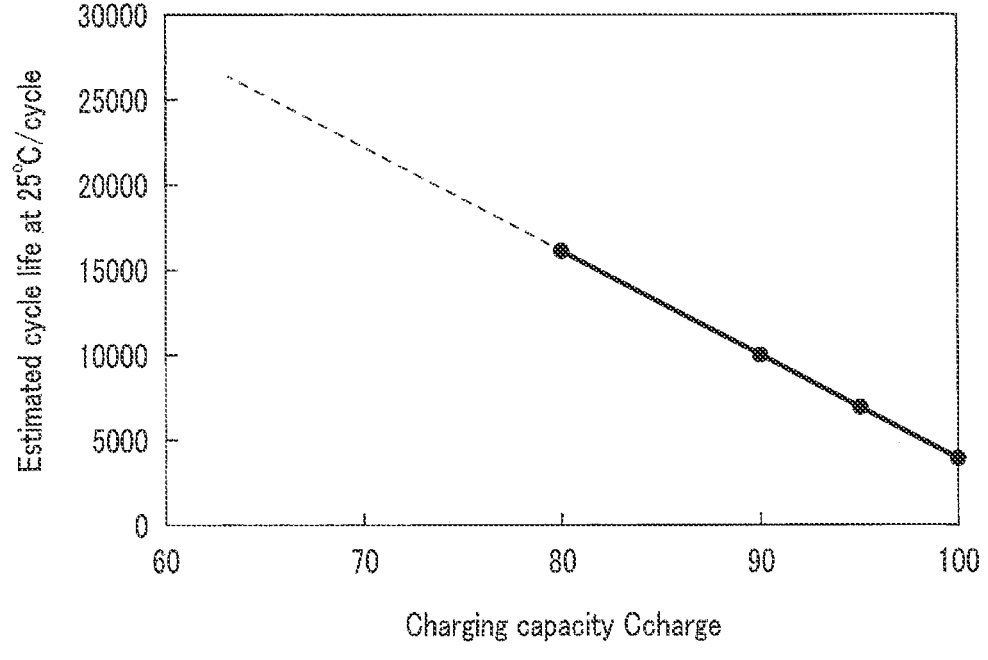
FIG. 3 is a diagram showing an example of a relationship among a temperature, a cycle life, and a charging capacity of a battery.

FIG. 3 is a diagram showing an example of a relationship among a temperature, a cycle life, and a charging capacity of a battery. FIG. 3 shows, for example, a cycle life estimated in a case of repeating charging of an NTO at various maximum charging capacities at a battery temperature of 25° C. The charging capacity on the abscissa axis of FIG. 3 is expressed as a percentage with a fully charged state as 100. Therefore, the charging capacity on the abscissa axis of FIG. 3 is equal to a charging rate. As shown in FIG. 3, under a constant temperature condition, the charging rate and the cycle life are nearly proportional to each other. For example, FIG. 3 shows that at a temperature of 25° C., the cycle life is about 4800 cycles when charging is repeated to the charging capacity of 100, i.e., to the fully charged state.

As described above, especially in the case of NTO, lithium diffusion tends to occur easily at high temperatures. This means that the charging capacity at high temperatures increases compared to the charging capacity at low temperatures. At high temperatures, excessive lithium insertion is likely to cause a decrease in cycle life. Therefore, it is preferable that charging be completed at a lower maximum charging capacity at high temperatures than that at low temperatures so that excessive lithium insertion is suppressed.

Figure 4:
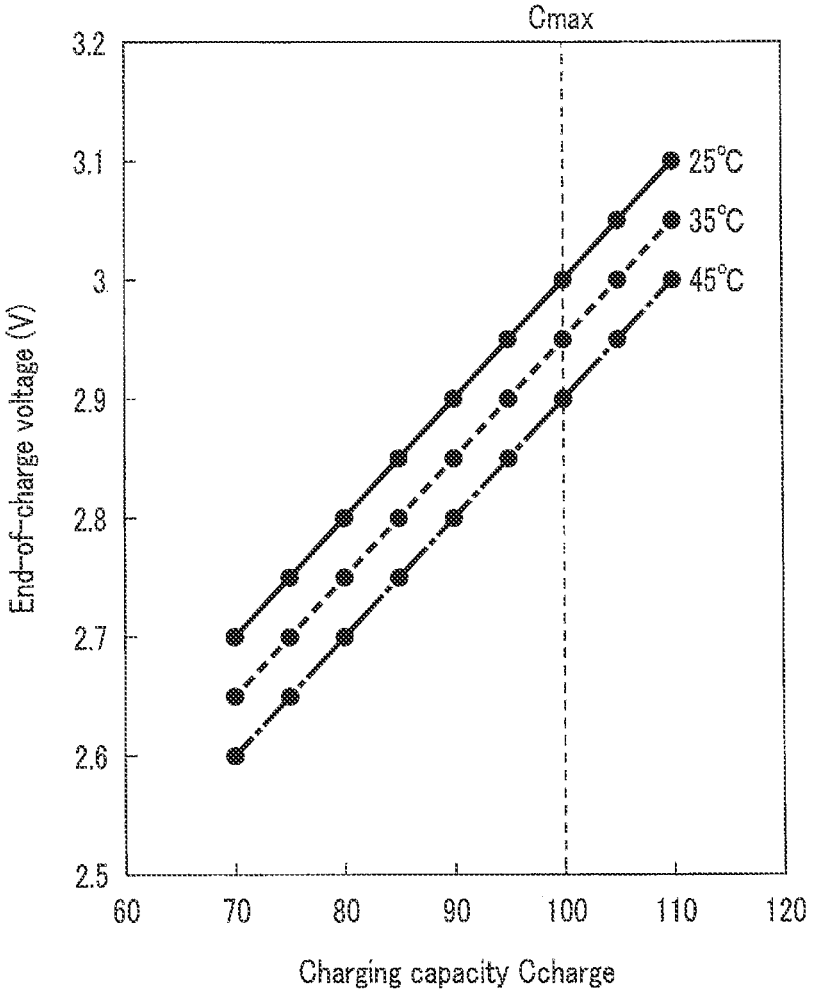
FIG. 4 is a diagram showing an example of information stored in a storage in a first embodiment.

FIG. 4 is a graph showing a relationship among the temperature, the charging capacity, and an end-of-charge voltage of the battery 2 as an example of the information stored in the storage 15 in the first embodiment. The graph in FIG. 4 can be generated by collecting the graph in FIG. 3 for each temperature of the battery 2 and calculating an end-of-charge voltage according to a charging capacity of each of the collected graphs. The charging capacity on the abscissa axis of FIG. 4 is expressed as a percentage with a fully charged state as 100. Therefore, the charging capacity on the abscissa axis of FIG. 4 is equal to a charging rate. The end-of-charge voltage is a threshold value of the charging voltage of the battery 2 to stop charging. For example, an end-of-charge voltage when the charging capacity is 100 corresponds to a charging voltage at which a relationship between a current charging capacity Ccharge and a maximum charging capacity C max is Ccharge−C max=0.

As shown in FIG. 4, the end-of-charge voltage varies depending on the temperature even when charging to the same charging rate. Specifically, the higher the temperature, the lower the end-of-charge voltage at which to charge to the same charging capacity. Charging beyond the end-of-charge voltage results in excessive charging, which affects the decrease in cycle life. Therefore, by referring to the graph in FIG. 4, the controller 10 acquires the end-of-charge voltage according to the temperature of the battery 2 detected by the temperature sensor 14 and controls the charging of the battery 2. The information stored in the storage 15 is not limited to being stored in the form of the graph shown in FIG. 4. The information stored in the storage 15 may be in a form other than the graph, such as in a form of a table showing the temperature, charging capacity, and end-of-charge voltage of the battery 2 shown in FIG. 4.

Figure 5:
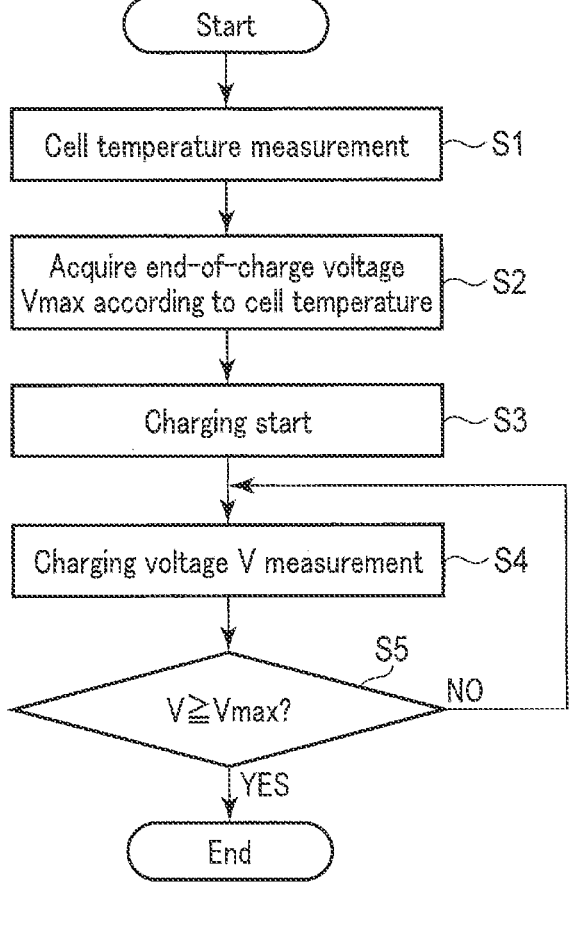
FIG. 5 is a flowchart showing a charging operation in a charge control apparatus of the first embodiment.

In the following, a charging operation in the first embodiment will be described FIG. 5 is a flowchart showing a charging operation in the charge control apparatus 1 of the first embodiment. The processing in FIG. 5 is performed by the controller 10, for example. In the following example, it is assumed that charging is controlled so that the charging capacity is 100, i.e., the charging rate is 100%.

In step S1, the controller 10 acquires a temperature of the battery 2 that is measured by the temperature sensor 14. As described above, the temperature sensor 14 may make measurements in units of single cells, in units of cell blocks, or in units of battery modules. When the temperatures of multiple locations in the battery 2, such as units of single cells, are measured, the controller 10 acquires the highest temperature among the measured temperatures. This is because, when considering controlling the charging of each single cell with the same end-of-charge voltage, controlling the charging based on the single cell with the highest cell temperature, i.e., the lowest end-of-charge voltage, will more greatly suppress the decrease in life.

In step S2, the controller 10 refers to the graph in FIG. 4 to acquire an end-of-charge voltage Vmax at which the charging capacity corresponding to the acquired temperature becomes 100. For example, if the acquired temperature is 45° C., the controller 10 acquires an end-of-charge voltage Vmax at an intersection of the 45° C. line and C max. An end-of-charge voltage for a temperature not stored in the storage 15 can be acquired by interpolation or extrapolation based on the graph in FIG. 4. For example, an end-of-charge voltage at 30° C. is calculated as an average value of an end-of-charge voltage at 25° C. and an end-of-charge voltage at 35° C.

In step S3, the controller 10 controls the drive circuit 11 to start charging of the battery 2. The charging may be performed, for example, by a constant-current method. The constant-current method is a method that supplies power to the battery 2 so that a current flowing through the battery 2 is constant. In this case, the controller 10 performs charging while monitoring a charging current and a charging voltage of the battery 2 by means of the current detection circuit 12 and the voltage detection circuit 13.

In step S4, the controller 10 acquires a charging voltage V of the battery 2 from the voltage detection circuit 13. Acquisition of the charging voltage V may be performed for each predetermined sampling period.

In step S5, the controller 10 determines if V≥V max. In step S5, if V≥V max does not hold true, the process returns to step S4. In this case, the charging is continued. In step S5, if V≥V max, the controller 10 controls the drive circuit 11 to stop the charging of the battery 2. The controller then ends the processing in FIG. 5.

As described above, according to the first embodiment, the charging of the battery 2 is controlled with the end-of-charge voltage according to the temperature of the battery 2. Specifically, the charging of the battery 2 is controlled with a lower end-of-charge voltage as the temperature of the battery 2 becomes higher. This allows the charging to be controlled at a maximally high charging capacity that suppresses excessive lithium insertion at each temperature, resulting in both high capacity and long life. In addition, when an oxide containing niobium is used as a negative electrode active material, in particular, an effect of a decrease in cycle life due to temperature is significant. Therefore, the technique of the first embodiment is particularly effective when the effect of the decrease in cycle life due to temperature is significant in the case where an oxide containing niobium is used as the negative electrode active material, etc. On the other hand, the technique of the first embodiment is also applicable to cases in which an oxide containing niobium is not used as a negative electrode active material.

In FIG. 5, the stopping of the charging of the battery 2 is determined based on the charging voltage. In contrast, if it is possible to measure the charging capacity of the battery 2, the stopping of the charging of the battery 2 may be determined based on the charging capacity. In this case, the graph in FIG. 3 for each temperature is stored in the storage 15 instead of the graph, in FIG. 4. The controller 10 then acquires a maximum charging capacity as a threshold value for stopping the charging instead of the end-of-charge voltage in step S2 and acquires the charging capacity in step S3. The controller 10 then determines if Ccharge−C max≥in step S4, and if Ccharge−C max≥0, stops the charging of the battery 2.

Further, the battery 2 may be charged by a constant-current/constant-voltage method instead of the constant-current method. The constant-current/constant-voltage method is a method in which charging is performed at a constant current until a charging voltage reaches a certain threshold voltage, and after the charging voltage reaches the threshold voltage, charging is performed by controlling a charging current so that the charging voltage becomes an end-of-charge voltage. In the constant-current/constant-voltage method, after switching to a constant--voltage method, the controller 10 can determine whether or not to stop the charging based on whether or not the charging current reaches zero. Therefore, in the constant-current/constant-voltage method, there can be two threshold values for stopping the charging: the threshold value for the charging voltage and the threshold value for the charging current.

Second Embodiment

Next, a second embodiment will be described. In the second embodiment, descriptions that overlap with the first embodiment are omitted or simplified. For example, a configuration of a charge control apparatus in the second embodiment may be similar to that described in FIG. 1. Therefore, descriptions thereof are omitted.

In the first embodiment, the charging is controlled according to the temperature so that the charging capacity becomes 100. On the other hand, as is also shown in FIG. 3, if the maximum charging capacity is set to be low even at the same temperature, the decrease in cycle life becomes small. Conversely, if the cycle life can be decreased, charging with a charging capacity exceeding 100 can also be performed by increasing the end-of-charge voltage. The second embodiment is an example that enables the use of a mode that prioritizes the cycle life and a mode that prioritizes the charging capacity.

FIG. 6 is a graph showing information on a relationship among a temperature, a cycle life, and an end-of-charge voltage of a battery as an example of information further stored in the storage 15 in the second embodiment. As described in FIG. 3, under a constant temperature condition, the charging capacity and the cycle life are nearly proportional to each other. In addition, as described in FIG. 4, under a constant temperature condition, the charging capacity and the end-of-charge voltage are nearly proportional to each other. Therefore, as shown in FIG. 6, under a constant temperature condition, the end-of-charge voltage and the cycle life are also nearly proportional to each other. Thus, an end-of-charge voltage that can satisfy a condition of a given cycle life can be acquired from the graph of FIG. 6. In addition, an end-of-charge voltage that can satisfy a condition of a given charging capacity can be acquired from the graph of FIG. 4. In the example in FIG. 6, at a temperature of 25° C., a cycle life in a case where charging with a charging capacity of 100, i.e., at an end-of-charge voltage of 3.0 V, is repeated is about 4800 cycles. To extend this cycle life, the end-of-charge voltage should be set to be lower than 3.0 V. Simply, assuming that no charging has ever been performed, the end-of-charge voltage is set at 2.95 V so that the cycle life is extended to about 10000 cycles. In practice, the cycle life is calculated as an average value in a case of assuming that charging that also includes an end-of-charge voltage set in the past is performed.

Figure 7:
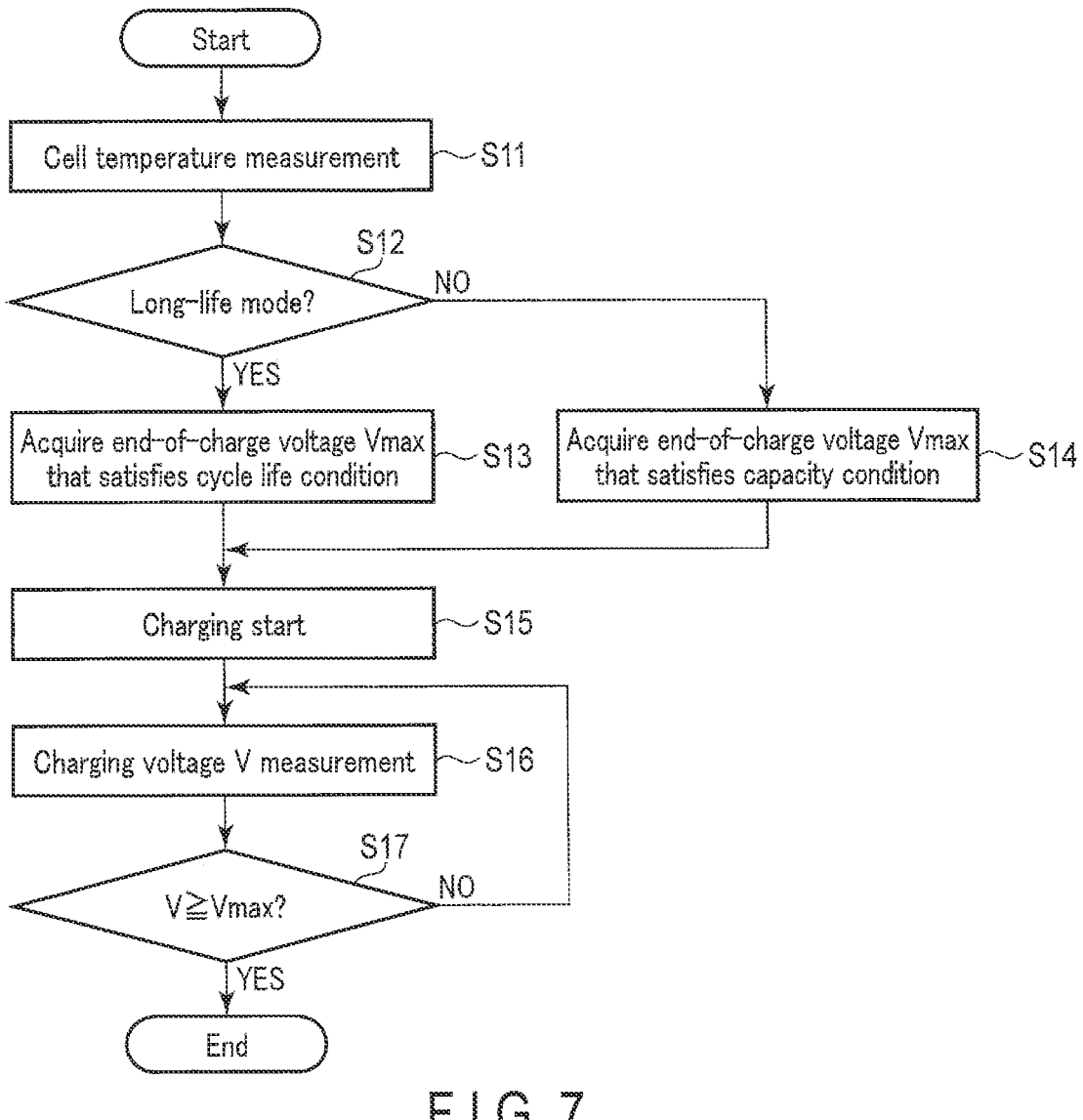
FIG. 7 is a flowchart showing a charging operation in a charge control apparatus of the second embodiment.

In the following, a charging operation in the second embodiment will be described. FIG. 7 is a flowchart showing a charging operation in a charge control apparatus 1 of the second embodiment. The processing in FIG. 7 is performed by the controller 10, for example.

In step S11, the controller 10 acquires a temperature of the battery 2 that is measured by the temperature sensor 14. In the same manner as in the first embodiment, when the temperatures of multiple locations in the battery 2 are measured, the controller 10 acquires the highest temperature among the measured temperatures.

In step S12, the controller 10 determines whether or not a charging mode of the battery 2 is a long-life mode. In the second embodiment, the long-life mode and a high-capacity mode are prepared as the charging mode of the battery 2. The long-life mode is a mode in which the cycle life is prioritized over the charging capacity. For example, in the long-life mode, an end-of-charge voltage is set so that the cycle life is a certain set value, e.g., 10000 cycles. On the other hand, the high-capacity mode is a mode in which the charging capacity is prioritized over the cycle life. In the high-capacity mode, an end-of-charge Voltage is set so that the charging capacity is set to a certain set value, e.g., 120. Designation of the long-life mode and the high-capacity mode is made, for example, by an operation of the operation device by the user of the battery-mounted equipment 6. In step S12, if it is determined that the charging mode of the battery 2 is the long-life mode, the process proceeds to step S13. In step S12, if it is determined that the charging mode of the battery 2 is not the long-life mode, i.e., is the high-capacity mode, the process proceeds to step S14. In the second embodiment, a normal mode may be prepared as the charging mode of the battery 2. The normal mode is, for example, a mode in which charging is controlled so that the charging capacity is 100 and the decrease in life is suppressed in the same manner as described in the first embodiment. In addition, when setting the charging mode, a current charging mode may be presented to the user by the presentation device.

In step S13, the controller 10 acquires an end-of-charge voltage Vmax that satisfies a condition of a cycle life in the long-life mode based on the acquired temperature. In step S14, the controller 10 acquires an end-of-charge voltage Vmax that satisfies a condition of a charging capacity in the high-capacity mode based on the acquired temperature. After steps S13 and S14, the process proceeds to step S15. As in the first embodiment, stopping of charging may be determined based on the charging capacity. In this case, the controller 10 may acquire a maximum charging capacity according to the temperature instead of the end-of-charge voltage.

In step S15, the controller 10 controls the drive circuit 11 to start charging of the battery 2. The charging may be performed, for example, by a constant-current method as in the first embodiment. In addition, the charging may be performed by a constant-current/constant-voltage method as in the first embodiment. In the following, a description is given assuming that the charging is performed by the constant-current method.

In step S16, the controller 10 acquires a charging voltage V of the battery 2 from the voltage detection circuit 13. Acquisition of the charging voltage V may be performed for each predetermined sampling period.

In step S17, the controller 10 determines if V≥V max. In step S17, if V≥V max does not hold true, the process returns to step S16. In this case, the charging is continued. In step S17, if V≥V max, the controller 10 controls the drive circuit 11 to stop the charging of the battery 2. Then, the controller 10 ends the processing in FIG. 7.

As described above, according to the second embodiment, the end-of-charge voltage according to the cycle life condition or charging capacity condition is set. This allows charging control to be implemented according to a request of the user, According to the second embodiment, the temperature of the battery 2 is taken into account in setting the end-of-charge voltage in both the long-life mode and the high-capacity mode. Therefore, not only in the long-life mode, but even in the high-capacity mode, excessive charging is suppressed to extend the life.

Here, in the long-life mode, the set value of the cycle life may be designated by the user. Similarly, in the high-capacity mode, the set value of the charging capacity may be designated by the user. Such designations can be, for example, made by an operation of the operation device by the user of the battery-mounted equipment 6. By setting the end-of-charge voltage, etc. based on the set value designated by the user and the temperature of the battery 2, charge control can be implemented more in accordance with the user's request.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charge control method comprising:
   acquiring a measured temperature of a lithium ion battery, the lithium ion battery including a negative electrode using one of a niobium-tungsten oxide, a niobium-molybdenum oxide, and a lithium titanate as an active material;
   acquiring an end-of-charge voltage for stopping charging of the lithium ion battery according to the measured temperature of the lithium ion battery based on a relationship between a cycle life and a charging capacity of the lithium ion battery for each temperature of the lithium ion battery; and
   charging the lithium ion battery based on the end-of-charge voltage,
   wherein the acquiring the end-of-charge voltage comprises:
   determining whether a charging mode is a long-life mode or a high-capacity mode;
   acquiring, in a case where the high-capacity mode is selected by a user operation, an end-of-charge voltage that exceeds a full-charge end-of-charge voltage determined based on the relationship between the cycle life and the charging capacity of the lithium ion battery for each temperature of the lithium ion battery; and
   acquiring, in a case where the long-life mode is selected by the user operation, an end-of-charge voltage that falls below the full-charge end-of-charge voltage determined based on the relationship between the cycle life and the charging capacity of the lithium ion battery for each temperature of the lithium ion battery.

2. The charge control method according to claim 1, wherein
   the lithium ion battery includes a plurality of battery cells, and
   the acquiring a measured temperature of the lithium ion battery includes acquiring a highest temperature among measured temperatures of the battery cells.

3. A charge control apparatus comprising a controller configured to:

acquire a measured temperature of a lithium ion battery, the lithium ion battery including a negative electrode using one of a niobium-tungsten oxide, a niobium-molybdenum oxide, and a lithium titanate as an active material;

acquire an end-of-charge voltage for stopping charging of the lithium ion battery according to the measured temperature of the lithium ion battery, based on a relationship between a cycle life and a charging capacity of the lithium ion battery for each temperature of the lithium ion battery; and charge the lithium ion battery based on the end-of-charge voltage, wherein in acquiring the end-of-charge voltage, the controller is configured to:

determine whether a charging mode is a long-life mode or a high-capacity mode;

acquire, in a case where the high-capacity mode is selected by a user operation, an end-of-charge voltage that exceeds a full-charge end-of-charge voltage determined based on the relationship between the cycle life and the charging capacity of the lithium ion battery for each temperature of the lithium ion battery; and acquire, in a case where the long-life mode is selected by the user operation, an end-of-charge voltage that falls below the full-charge end-of-charge voltage determined based on the relationship between the cycle life and the charging capacity of the lithium ion battery for each temperature of the lithium ion battery.

4. Battery-mounted equipment comprising the charge control apparatus according to claim 3.

* * * * *